United States Patent [19]

Eguchi

[11] 4,177,404
[45] Dec. 4, 1979

[54] ARC DETECTOR FOR GLOW DISCHARGES

[75] Inventor: Ronald G. Eguchi, Long Beach, Calif.

[73] Assignee: Northrop Corporation, Los Angeles, Calif.

[21] Appl. No.: 895,727

[22] Filed: Apr. 12, 1978

[51] Int. Cl.² .................... H05B 41/36; H02H 7/20
[52] U.S. Cl. .................................. 315/151; 250/209; 250/578; 315/125; 315/134; 315/155; 315/156; 328/8
[58] Field of Search ............... 315/119, 125, 134, 149, 315/151, 155, 156, 159; 250/206, 209, 578; 328/8, 9; 324/20 R, 33; 307/117

[56] References Cited
U.S. PATENT DOCUMENTS

| 1,899,594 | 2/1933 | Simon | 315/119 |
| 3,801,821 | 4/1974 | Sharpe | 250/209 |

Primary Examiner—Eugene R. La Roche
Attorney, Agent, or Firm—William W. Rundle; Willard M. Graham

[57] ABSTRACT

A plurality of photodetectors in a single line exposed to a field of view transversely across the complete region of a glow discharge volume. The detectors are connected in an electronic circuit to trigger a crowbar device across the power supply circuit providing the voltage producing the discharge when any one detector receives an optical input substantially greater than normal, thereby preventing damage to the discharge electrodes due to arcing across the glow discharge.

14 Claims, 3 Drawing Figures

ARC DETECTOR FOR GLOW DISCHARGES

The invention herein described was made in the course of Contract No. F29601-76-C-0006 with the United States Air Force.

BACKGROUND OF THE INVENTION

1. Field of the Invention

The present invention relates to electric glow discharges, and more particularly, to a means and method for preventing damage to the electrodes due to arcing across a relatively large-volume electrically-excited glow discharge, such as in a laser, for example.

2. Description of the Prior Art

In a large volume electric plasma or a glow discharge, instabilities will result in a transition from a diffuse glow discharge to a highly localized metal vapor arc. These arcs cause significant erosion and damage to the electrodes if allowed to persist. The usual method for protecting a load from an arc includes connecting a "crowbar" device in parallel with the load, which is done in this invention also. The crowbar is a gas tube or a spark gap, for example, which has a very low impedance when triggered by a conventional control circuit used to sense a rapidly increasing current when an arc forms in the glow discharge. The voltage across the load is thus caused to fall to a low level insufficient to sustain the arc, and the arc is extinguished.

Other conventional methods of initiating the crowbar trigger employ the sensing of the load current, the load voltage, the rate of change of the load current or of the load voltage. All of these methods, however, are highly susceptible to electrical noise and transients so that the threshold level for detecting an overload current, for instance, must typically be set to 1.5 or 2 times the normal current level to avoid false triggering of the crowbar because of the difficulty of discriminating between an arc and electrical transients in the system. This type of crowbar control is unsatisfactory in cases where the electrodes are easily damaged by arcs, where the presence of an arc must be detected as early as possible, before the load current has increased significantly.

Other prior art known is the U.S. Pat. No. 3,801,821, for a Large Field Flash Sensor, which discloses a plurality of optical sensors with lens means to cover a large field of view, for detecting the presence and direction of one or more small flashing targets. When a target is detected, a warning light or tone is produced. Nothing is disclosed or suggested concerning the optical detection and prevention of electric arcs in a normal glow discharge.

SUMMARY OF THE INVENTION

It is an object of the present invention to provide a means and method for detecting and preventing damage due to an arc in a normal electric glow discharge. A further object is to detect an arc and act thereon before the load current increases significantly.

Different gases and pressures of gases, and different metals for electrodes are used in various applications of electric glow discharges. Still another object of this invention is to provide means for discriminating between a normal glow discharge and the beginning of formation of an arc therein in applications of glow discharges using different constituents.

A yet further object is to provide an arc detector for a glow discharge wherein no false arc indications are obtained due to electrical noise and transient currents in the discharge circuits.

When an arc occurs in an electric glow discharge, it creates a narrow, roughly cylindrical, channel of highly ionized gas and metal vapor between the anode and cathode. The luminosity of the arc is many times greater than the luminosity of the glow discharge, since the current density is much greater and the electrical-to-optical power conversion is more efficient. It has been found that, during the formation of an arc, an increase in the gas luminosity in the arc channel usually preceeds any observable increase in the load current by a time from a few tens of nanoseconds to a few microseconds, depending on the discharge volume, geometry, gas mixture and the like.

Briefly, my invention comprises detecting the optical radiation output of or from a glow discharge volume and triggering a crowbar device when the optical output magnitude of any predetermined fractional portion of the discharge region increases substantially from its normal amount. To accomplish this, a plurality of photo-detectors is prefereably arranged in a row and combined with a lens so that each photodetector receives optical radiation emanating from a different individual space in the discharge region transversely across the entire discharge extent. Each photodetector is in a separate electrical circuit havng amplifier and trigger means connected logically to the trigger electrode of a suitable conventional crowbar device. The crowbar is electrically connected in parallel with the glow discharge, as is customary, so that triggering the crowbar creates an immediate short circuit across the glow discharge.

Each trigger means is preset to produce an output signal when its input voltage or current reaches a threshold corresponding to a predetermined magnitude of optical radiation on its associated photodetector which is appreciably greater than from the ordinary glow discharge. The threshold level may be made variable to accomodate a variety of operating conditions, since the electrical-to-optical conversion efficiency is a function of parameters such as discharge voltage, current density, gas mixture and the like.

An aperture or window is provided in the field of view of the photodetectors to exclude both the anode and the cathode from the detector field of view, to prevent luminous electrode spots from causing false indications.

In applications where the gaseous discharge is predominantly one color and the arc is another color, it is advantageous to include an optical filter in the field of view of the photodetectors, making the filter substantially opaque to the major glow color and transmissive to the arc color.

DESCRIPTION OF PREFERRED EMBODIMENT

Figure 1:
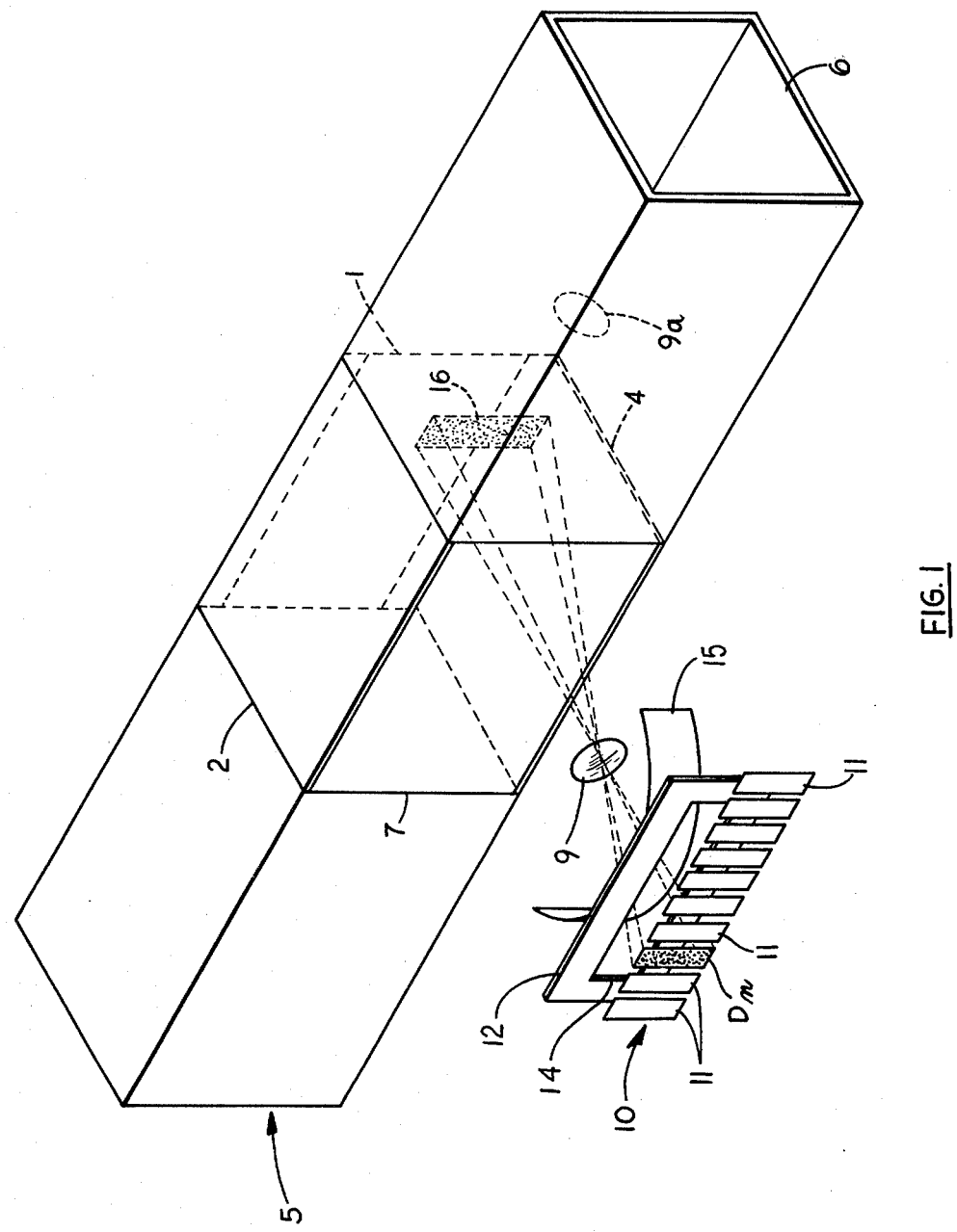
FIG. 1 is a pictorial view showing the arrangement of an array of photodetectors for viewing the transverse extent of a glow discharge volume.

In FIG. 1, a glow discharge volume 1 is formed between an anode 2 and a cathode 4 on the top and bottom, respectively, of a rectangular casing 5. The casing 5 is closed around at least the top, bottom, front and rear sides thereof, and represents the locale of any electric glow discharge or plasma in general. A high voltage applied across the anode 2 and cathode 4, which are insulated from each other by non-conductive sides of the casing for example, will provide the energy for the discharge, and the casing interior will usually contain a certain gas or mixture of gases at a predetermined low or even atmospheric pressure for formation of a conventional glow discharge. A particular application of this invention is in a transverse E-beam excited gas laser, where the casing extends beyond the anode 2 and cathode 4 in one dimension to form a portion of a laser cavity 6, for example.

The front side of casing 5 has a window 7 extending horizontally for the length of anode 2 and cathode 4 and substantially all the way vertically between the anode 2 and cathode 4. An optical lens 9 is mounted outside the front side of casing 5. Lens 9 images the glow discharge volume 1 into a linear detector array 10 comprising a plurality of essentially adjacent photodetectors 11. The linear extent of the array 10 is preferably parallel to the planes of the anode 2 and cathode 4. An aperture plate 12 shown located between lens 9 and array 10 has a field-limiting aperture 14 with upper and lower edges positioned to exclude the anode 2 and cathode 4 from the detector field of view. The aperture 14 thus prevents any high-luminosity anode and cathode spots formed during normal glow discharge from reaching the photodetectors 11 and causing false arc indications.

One or more detector array-lens assemblies may be placed in several locations in the sides of casing 5 in order to achieve total coverage of certain sizes and shapes of discharge volumes which can occur in actual practice. There may be areas of the discharge volume where the fields of view of the various detector arrays overlap. This redundant coverage is not detrimental, but will serve to increase the reliability of the apparatus.

An optical filter 15 may be provided in the field of view of the photodetectors 11. This filter will improve the performance of the arc detector in instances where the arc which might occur has a different color from just the normal glow discharge. In such instances, the filter 15 should be made of a material which is opaque to the glow discharge radiation but transmissive to the arc radiation. Thus, if the glow discharge region contains a substantial amount of argon, for example, the filter 15 would be capable of cutting off or attenuating yellow-green, but transmitting blue-green. The filter 15 may be a thin film of color substance deposited on a substrate or a multilayer thin-film interference filter. Also, the filter is preferably curved to be perpendicular to the incident rays when a multilayer interference filter is used.

An array of detectors is used rather than a single detector for the purpose of increasing the system sensitivity to arcs. It does this by decreasing the field of view of each detector, and hence the optical power received by each. Since an arc is highly localized, the optical output of an arc will fall on only one or two photodetectors 11, the particular detector or detectors being determined by the relative left-to-right position of the arc in the glow discharge volume 1. For instance, an arc occurring in the region of rectangle 16 in FIG. 1 will be detected by only the nth photodetector $D_n$ of the group shown. No restriction is placed on the total number of photodetectors 11 to be used. In one example, sixteen are used to cover the entire width of the discharge volume 1. The fact that the detector's vertical field of view is limited does not detract from the sensitivity since any arc will strike from anode 2 to cathode 4 and be visible through the aperture 14.

Although the photodetectors 11 will not be in the exact focal plane for all the arc positions between the front and rear side of the casing 5, this does not matter because an arc will still produce sufficiently intense light on the photodetector to produce an output signal. Further, this system will have a relatively large "f" number so that the depth of field is also relatively great. The optics are preferably dimensioned to have the "in focus" area centered along the longitudinal extent of the casing 5 in FIG. 1.

The rectangular shape of the photodetectors 11 is used for illustration only, and this does not mean that the actual radiation-sensitive area is required to be any one particular shape.

Figure 2:
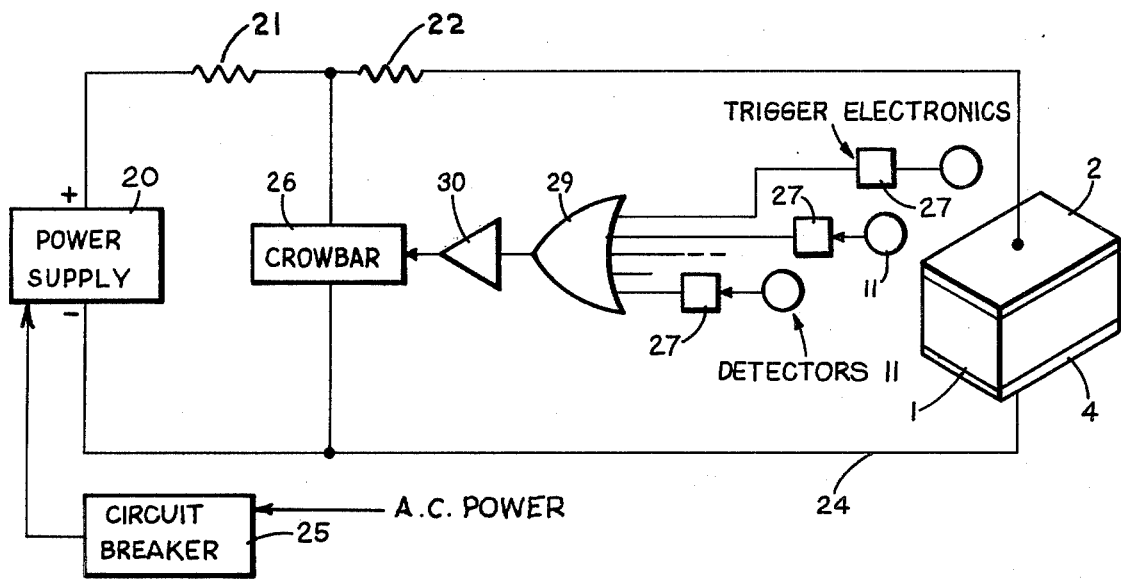
FIG. 2 is a block diagram showing the electrical connections of the detectors in FIG. 1 into a crowbar system for the glow discharge volume.

FIG. 2 shows the preferred electrical circuit of the present detector invention. A high-voltage DC power supply 20 produces the electrical power to generate the discharge in the glow discharge volume 1. Two current-limiting resistances 21 and 22 are connected in series between the positive pole of the power supply 20 and the anode 2, and a return line 24 connects the negative pole of power supply 20 to the cathode 4. A circuit breaker 25 is also a usual component of the circuit. The glow discharge voltage may be in the range of 5KV to 50KV, for example, depending upon the anode-to-cathode separation, and the voltage of the power supply 20 may be about 10% greater than the glow discharge voltage.

A crowbar device 26 is connected from the junction of resistances 21 and 22 to the return line 24. The electrical output of each photodetector 11 arranged as described for FIG. 1 is connected to suitable electronic trigger means 27, and these are each connected respectively to a separate input line of an OR gate 29. The OR gate output goes through amplifier and crowbar driver means 30 to the trigger electrode of the crowbar 26.

Trigger means 27 each comprises a comparator, or threshold device, to generate a discrete output signal when its input signal reaches a certain preset magnitude, such as in a Schmitt trigger, for example. Such trigger means are preferably solid state devices commercially available in the form of integrated circuit chips.

When any photodetector 11 receives an increased optical input indicating the formation of an arc, the threshold of its associated trigger means 27 will be exceeded, causing the trigger means to produce its output signal. Such signal also appears at the output of OR gate 29 and, through driver means 30, triggers the crowbar 26.

When crowbar 26 is triggered, the voltage across it falls to a very low level insufficient to sustain an arc in the load, and the arc under formation is effectively starved out and extinguished. The accompanying dramatic increase in power supply current when the crowbar 26 is triggered also opens the circuit breaker 25, and the system is thus shut down until the cause of the arc can be cleared and the circuit reset.

Due to the fact that the optical output from the glow discharge volume 1 caused by the beginning of an arc will trigger the crowbar 26 before the actual arc current has increased significantly, no anode or cathode damage will occur, even with easily damaged electrodes.

If only a single photodetector were to be used, the optical output of the arc would have to become comparable to the optical output of the entire glow discharge before a fault condition (arc) could be detected, whereas when an array of photodetectors is used as herein disclosed, the arc's optical output would only have to be comparable to that from only a small portion of the discharge volume to trigger the crowbar 26. Thus, a greatly improved signal-to-noise ratio is achieved. Actually, the luminosity of an arc is ten times, or more, as great as the luminosity of the glow discharge, and therefore the present concept gives a very sensitive arc detector.

Figure 3:
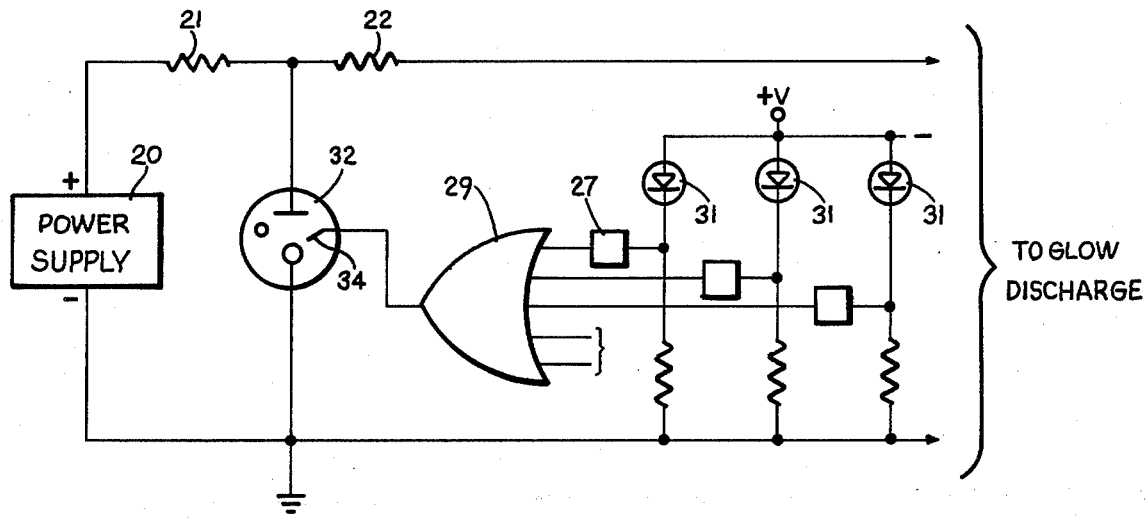
FIG. 3 is a partial block and schematic diagram showing examples of particular photodetector and crowbar devices in the system of FIG. 2.

The photodetectors 11 are prefereably linear-acting solid state devices, and may be comprised of small silicon PIN photodiodes 31, for example, as shown in FIG. 3. The photodetectors should be responsive to radiation in the near infrared, visible and near ultra-violet portions of the spectrum.

The crowbar 26 may be any conventional type capable of carrying the required surge of current for a specific case. It may be a gas tube 32 (such as an ignitron, for example) as shown in FIG. 3, having a trigger electrode 34 connected to the output of the OR gate 29. An amplifier may also be interposed between the OR gate 29 and gas tube 32. A spark gap or thyratron device with trigger electrode could also be the crowbar 26.

Thus it is seen that a very efficient and sensitive arc detecting method and means are provided, which prevents an arc from causing any damage to the electrode surfaces of a high-voltage electric discharge.

Various modifications can be made to the apparatus disclosed herein within the scope of the present invention. The window 7 may be an opening into a side passage or cavity containing the optics and detectors, for example. The aperture plate 12 could be eliminated by having the window 7 in the front casing side made the proper dimensions to serve as a limiting aperture. The detectors 11 are located in any plane or line which gives them a field of view cutting across the direction from anode to cathode, i.e., the discharge volume portion "seen" by the detector array 10 is normal to the arc which would appear. In a subsonic flow gas laser, for example, the detectors and optics may be placed within the casing 5, longitudinally of the cavity 6, such as indicated by the dotted line position 9a of the lens in FIG. 1, for example. Other modifications may suggest themselves to persons skilled in the art.

While in order to comply with the statute, the invention has been described in language more or less specific as to structural features, it is to be understood that the invention is not limited to the specific features shown, but that the means and construction herein disclosed comprise the preferred mode of putting the invention into effect, and the invention is therefore claimed in any of its forms or modifications within the legitimate and valid scope of the appended claims.

What is claimed is:

1. The method of detecting an arc in an electric discharge volume between high-voltage electrodes, comprising sensing the optical radiation of each of a plurality of adjacent fractional portions across a full transverse portion of said volume, and detecting the increase of said radiation from any one of said fractional portions caused by said arc.

2. Method in accordance with claim 1 including producing an electrical signal output when said optical radiation increase is detected.

3. Method in accordance with claim 2 including shutting off the high voltage to said electrodes when said signal output occurs, whereby arc damage to said electrodes is prevented.

4. Method in accordance with claim 2 including providing a crowbar device in circuit with the high-voltage electrodes, and triggering said crowbar in response to said signal output.

5. In an electric discharge device having a discharge volume with an anode and a cathode on opposite sides thereof, and having a high voltage impressed across said anode and cathode for forming a stabilized glow in said discharge volume; means for preventing arcing across said volume, comprising:
   a. photodetector means;
   b. optical means presenting a complete transverse portion of said discharge volume to the field of view of said photodetector means;
   c. electrical output circuit means operatively connected to said photodetector means for producing an electrical signal in response to the optical power reaching said photodetector means from the luminosity of an arc beginning to form in said discharge volume; and
   d. means for cutting off the high voltage across said anode and cathode in response to said electrical signal.

6. Apparatus in accordance with claim 5 wherein said electrical output circuit means comprises means for producing an electrical quantity varying in accordance with the optical power received by said photodetector means from said portion of discharge volume, and threshold trigger means for producing said electrical signal at a predetermined threshold magnitude of said electrical quantity.

7. Apparatus in accordance with claim 5 wherein said photodetector means comprises an array of individual photodetector elements arranged side by side in a line substantially parallel to the planes of said anode and cathode, and wherein said optical means comprises lens means imaging said transverse portion of said discharge volume onto said array so that the field of view of respective said photodetector elements contains respective contiguous parts of said transverse portion from side to side.

8. Apparatus in accordance with claim 7 wherein said electrical output circuit means comprises a plurality of trigger means connected to said photodetector elements, respectively, each said trigger means being preset to produce an output when its input from its respective photodetector element indicates the beginning of an arc in its respective field of view, and the output of each said trigger means connected in OR logic function to said high voltage cut-off means.

9. Apparatus in accordance with claim 5 wherein said means for cutting off said high voltage comprises a crowbar device.

10. Apparatus in accordance with claim 5 including optical filter means in said field of view between said discharge volume and said photodetector means.

11. Apparatus in accordance with claim 5 including means defining a limiting aperture in said field of view, said aperture excluding said anode and said cathode from said field of view.

12. Means for preventing arcing across a gaseous glow discharge volume having planar type anode and cathode electrodes on opposite sides thereof, and power supply means for producing a high voltage across said electrodes, comprising:

a. a row of individual photoelectric detector elements aligned side by side;

b. optical lens means for imaging a full transverse portion of said discharge volume onto said row, each said detector element having a field of view comprising a respective one of contiguous parts of said transverse portion from side to side;

c. an electronic trigger circuit connected to the output of each of said detector elements; each said trigger circuit and its corresponding detector element being responsive to the optical radiation of an arc beginning to form in the field of view of said corresponding detector, to thereby produce a trigger output; and d. crowbar means connected substantially across said power supply means and said electrodes, said crowbar having a trigger element;

e. the output of each of said trigger circuits being effectively connected to said trigger element of said crowbar.

13. Apparatus in accordance with claim 12 including means defining a limiting aperture for excluding both said anode and said cathode from said field of view of all said detector elements.

14. Apparatus in accordance with claim 12 wherein said glow discharge volume and said electrodes are in a gas laser, and including window means in a wall of said laser for passing radiant energy from said discharge volume to said detector elements.

* * * * *